United States Patent
Schwenke et al.

(10) Patent No.: US 9,871,199 B2
(45) Date of Patent: Jan. 16, 2018

(54) LIGHT EMISSIVE PLASTIC GLAZING HAVING A MULTILAYERED CONFIGURATION FOR ILLUMINATING PASSENGER COMPARTMENT

(71) Applicant: EXATEC LLC, Wixom, MI (US)

(72) Inventors: Robert Schwenke, Box Elder, SD (US); Wilfried Hedderich, Hilden (DE); Chengtao Li, Mason, MI (US); Christophe Lefaux, Suzhou (CN); Ken Foster, Brighton, MI (US)

(73) Assignee: SABIC GLOBAL TECHNOLOGIES B.V., Bergen op Zoom (NL)

( * ) Notice: Subject to any disclaimer, the term of this patent is extended or adjusted under 35 U.S.C. 154(b) by 119 days.

(21) Appl. No.: 15/066,466

(22) Filed: Mar. 10, 2016

(65) Prior Publication Data
US 2016/0185287 A1 Jun. 30, 2016

Related U.S. Application Data

(63) Continuation of application No. 14/482,180, filed on Sep. 10, 2014, now Pat. No. 9,315,148, which is a
(Continued)

(51) Int. Cl.
*H01L 51/00* (2006.01)
*B32B 27/08* (2006.01)
(Continued)

(52) U.S. Cl.
CPC .......... *H01L 51/0035* (2013.01); *B32B 27/08* (2013.01); *B32B 27/30* (2013.01);
(Continued)

(58) Field of Classification Search
CPC .......... F21Y 2105/00; F21Y 2105/001; F21Y 2105/003; F21Y 2105/005;
(Continued)

(56) References Cited

U.S. PATENT DOCUMENTS 3,012,164 A 12/1961 Franzone et al.
4,443,832 A * 4/1984 Kanamori ............... B60Q 1/26
362/311.13
(Continued)

FOREIGN PATENT DOCUMENTS

DE 19852593 A1 5/2000
DE 20202435 A1 6/2002
(Continued)

OTHER PUBLICATIONS

Design of Organic Electroluminescent Displays with Ultraviolet-Shielding Filters, R.H. Lee, C.Y. Huang, C-Ti Chen, Journal of Applied Polymer Science, vol. 92, 1432-1436 (2004).
(Continued)

*Primary Examiner* — Robert May
(74) *Attorney, Agent, or Firm* — Cantor Colburn LLP

(57) ABSTRACT

In an embodiment, a light emissive window assembly for providing illumination to an occupant compartment of an automobile comprises a window panel comprising a transparent viewing area and an emissive area, wherein the emissive area is configured to emit light into the occupant compartment and the transparent viewing area is not configured to emit light; wherein the emissive area comprises an abrasion resistant layer, an ultraviolet protective layer, a base layer, and an emissive layer; wherein the ultraviolet protective layer is located in between the abrasion resistant layer and the base layer; and wherein the base layer is located in between the ultraviolet protective layer and the emissive layer.

19 Claims, 8 Drawing Sheets

Related U.S. Application Data continuation of application No. 11/317,587, filed on Dec. 23, 2005, now abandoned.

(60) Provisional application No. 60/663,237, filed on Mar. 18, 2005.

(51) Int. Cl.

| | | |
|---|---|---|
| *B32B 27/30* | (2006.01) | |
| *B32B 27/36* | (2006.01) | |
| *B60J 1/00* | (2006.01) | |
| *F21V 8/00* | (2006.01) | |
| *B60J 1/08* | (2006.01) | |
| *B60Q 3/64* | (2017.01) | |
| *B60Q 3/208* | (2017.01) | |
| *B60Q 3/74* | (2017.01) | |
| *H01L 51/52* | (2006.01) | |

(52) U.S. Cl.
CPC ............ *B32B 27/36* (2013.01); *B32B 27/365* (2013.01); *B60J 1/00* (2013.01); *B60J 1/08* (2013.01); *B60Q 3/208* (2017.02); *B60Q 3/64* (2017.02); *B60Q 3/745* (2017.02); *G02B 6/0038* (2013.01); *G02B 6/0096* (2013.01); *H01L 51/5203* (2013.01); *H01L 51/524* (2013.01); *H01L 51/5284* (2013.01); *B32B 2255/10* (2013.01); *B32B 2255/20* (2013.01); *B32B 2255/205* (2013.01); *B32B 2255/26* (2013.01); *B32B 2255/28* (2013.01); *B32B 2307/202* (2013.01); *B32B 2307/412* (2013.01); *B32B 2307/42* (2013.01); *B32B 2307/422* (2013.01); *B32B 2307/554* (2013.01); *B32B 2457/206* (2013.01); *B32B 2605/006* (2013.01); *H01L 51/0036* (2013.01); *H01L 51/0038* (2013.01); *H01L 51/0039* (2013.01); *H01L 51/5209* (2013.01); *H01L 51/5237* (2013.01); *H01L 51/5281* (2013.01); *H01L 2251/5361* (2013.01)

(58) Field of Classification Search
CPC ......... F21Y 2105/006; F21Y 2105/008; B60Q 3/0213; B60Q 1/302; B60Q 1/268; H05B 33/22; H05B 33/28
USPC ........................................................ 362/503
See application file for complete search history.

(56) References Cited

U.S. PATENT DOCUMENTS

| | | | |
|---|---|---|---|
| 4,645,970 A | | 2/1987 | Murphy |
| 4,749,261 A | | 6/1988 | McLaughlin et al. |
| 4,750,816 A | | 6/1988 | Ito et al. |
| 4,934,753 A | | 6/1990 | Gajewski |
| 5,336,965 A | | 8/1994 | Meyer et al. |
| 6,143,387 A | * | 11/2000 | Kubler .............. B32B 17/10018 216/24 |
| 6,309,755 B1 | | 10/2001 | Matsco et al. |
| 6,426,125 B1 | | 7/2002 | Yang et al. |
| 6,517,226 B1 | | 2/2003 | Zimmermann et al. |
| 6,666,571 B2 | | 12/2003 | Becher et al. |
| 6,686,032 B1 | * | 2/2004 | Nagai ............... B32B 17/10036 428/212 |
| 7,048,422 B1 | | 5/2006 | Solomon |
| 7,118,239 B2 | * | 10/2006 | Itoh ................... B32B 17/10036 313/512 |
| 7,414,357 B2 | | 8/2008 | Reul et al. |
| 7,537,361 B2 | | 5/2009 | Jugovic et al. |
| 7,794,125 B2 | | 9/2010 | Offermann et al. |
| 2005/0001456 A1 | | 1/2005 | Bohm et al. |

FOREIGN PATENT DOCUMENTS

| | | |
|---|---|---|
| DE | 10204359 A1 | 10/2002 |
| DE | 10241820 A1 | 3/2004 |
| DE | 10320614 A1 | 12/2004 |
| EP | 0334799 A2 | 9/1989 |
| EP | 1234721 A2 | 8/2002 |
| EP | 1365458 A1 | 11/2003 |
| GB | 2333829 A1 | 8/1999 |
| JP | 59011934 A | 1/1984 |
| JP | 11321304 | 11/1999 |
| JP | 2000260572 A | 9/2000 |
| JP | 2003019922 A | 1/2003 |
| JP | 2003053908 A | 2/2003 |
| JP | 2004160977 A | 6/2004 |
| JP | 2004355961 | 12/2004 |
| WO | 02098179 A1 | 12/2002 |
| WO | 03084810 A1 | 10/2003 |
| WO | 2004025749 A2 | 3/2004 |

OTHER PUBLICATIONS

Extended European Search Report; European Application No. 10175183.2-2124; dated Sep. 30, 2010; 7 Pages.
German Patent No. 10204359 (A1); Date of Publication: Oct. 17, 2002; Abstract Only; 1 Page.
German Patent No. 10320614 (A1); Date of Publication: Dec. 9, 2004.
German Patent No. 19852593 (A1); Date of Publication: May 25, 2000; Abstract Only; 1 Page.
German Patent No. 20202435 (U1); Publication Date: Jun. 6, 2002; Machine Translation; 23 Pages.
International Search Report; International Application No. PCT/US2006/009585; International Filing Date: Mar. 17, 2006; dated Jul. 18, 2006; 6 Pages.
Japanese Patent No. 11321304 (A); Publication Date: Nov. 24, 1999; Abstract Only; 1 Page.
Japanese Patent No. 2000260572 (A); Publication Date: Sep. 22, 2000; Abstract Only; 1 Page.
Japanese Patent No. 2003019922 (A); Publication Date: Jan. 21, 2003; Abstract Only; 1 Page.
Japanese Patent No. 2003053908 (A); Publication Date: Feb. 26, 2003; Abstract Only; 1 Page.
Japanese Patent No. 2004355961 (A); Date of Publication: Dec. 16, 2004; Abstract Only; 1 Page.
Japanese Patent No. 59011934 (A); Date of Publication: Jan. 21, 1984; Abstract Only; 1 Page.
Written Opinion of the International Searching Authority; International Application No. PCT/US2006/009585; International Filing Date: Mar. 17, 2006; dated Jul. 18, 2006; 7 Pages.

* cited by examiner

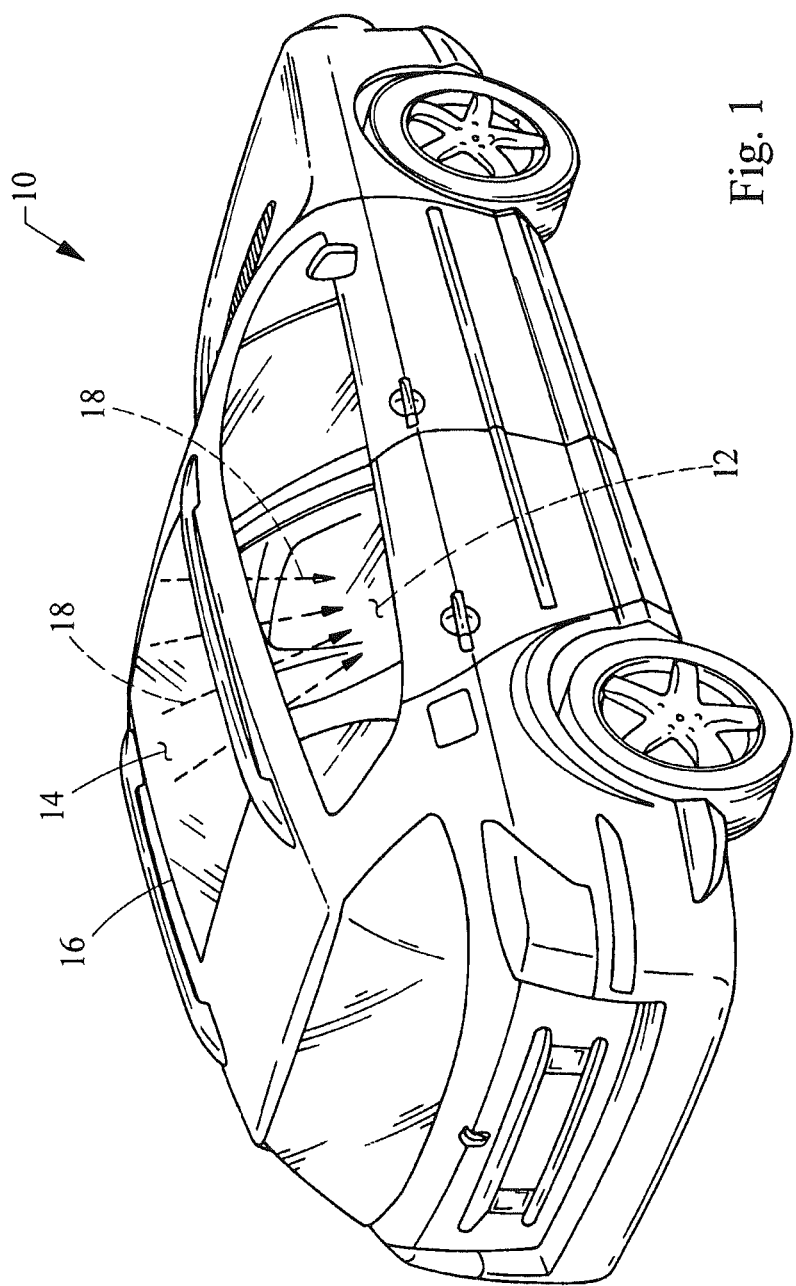

LIGHT EMISSIVE PLASTIC GLAZING HAVING A MULTILAYERED CONFIGURATION FOR ILLUMINATING PASSENGER COMPARTMENT

CROSS REFERENCE TO RELATED APPLICATIONS

This application claims the benefit of U.S. provisional application entitled "LIGHT EMISSIVE PLASTIC GLAZING", application No. 60/663,237 filed on Mar. 18, 2005 and is a continuation application of U.S. application Ser. No. 14/482,180 filed on Sep. 9, 2014, which is a continuation application of U.S. application Ser. No. 11/317,587 filed on Dec. 23, 2005.

FIELD

The present disclosure generally relates to vehicle occupant compartment lighting systems.

BACKGROUND

The occupant compartment of a vehicle, more particularly an automobile, typically uses one or more lighting system to provide general lighting to the occupant compartment of the vehicle. This lighting enhances the visibility of areas within the occupant compartment that are not provided with their own lighting, such as areas occupied by occupants and their belongings, the center console and vehicle controls. The lighting system that provides general visibility to the occupant compartment is usually placed within the compartment such that the light it produces illuminates as much of the occupant compartment as possible, while taking up the least amount of space. One such lighting system, also called a "dome light", is located near the center of the roof of the occupant compartment.

Automobiles can be equipped with transparent rectangular panels located near the center of the roof, commonly referred to as a "sunroof" or "moon roof". As stated earlier, the center location of the roof is the preferable position for the dome light. When a vehicle has a sunroof, the dome light must be moved to a less favorable location or eliminated, thus, reducing or eliminating effective general illumination of the occupant compartment.

Therefore, it is desired to provide a system which will provide adequate illumination of the occupant compartment of vehicles equipped with sunroofs.

BRIEF SUMMARY

In overcoming the drawbacks and limitations of the know technologies, a light emissive window assembly is disclosed. The assembly includes a first transparent layer and light emissive layer coupled to the first transparent layer. The first transparent layer can be made from a suitable material such as polycarbonate, polymethyl methacrylate, polyester blends or glass fibers or combinations thereof. The first transparent layer may further include an ultraviolet ("UV") blocking layer and/or an abrasion layer.

The light emissive layer may be a multistack of functionalities and can be applied directly using conventional printing technologies such as inkjet, screen printing, dispensing and sputtering or any other suitable method. A more preferable manufacturer would be a multilayer film. The multilayer film may be an electroluminescent display, organic light emitting display, a polymer light emitting display, or may be a light pipe having an entry point for receiving light generated by a light source, whereby light received at the entry point will travel within the light pipe via total internal reflection.

Additionally, a second transparent layer may be coupled to the emissive layer, thereby capsulating the emissive layer between the two transparent panels. The second transparent panel is constructed similarly to the first transparent panel and may have an abrasion layer and/or a UV blocking layer. The window assembly may be made by first forming a transparent panel having one side coated with an ultraviolet blocking layer and an abrasion layer. Next, a frame is formed around a potion of the perimeter of the plastic panel, thereby defining a cavity. A light source, such as the previously mentioned emissive layer, is placed within the cavity and bonded to the first transparent panel. A second transparent panel is thereafter attached to the frame and/or the first transparent panel, thereby encapsulating the light source.

These and other aspects and advantages of the present disclosure will become apparent upon reading the following detailed description in combination with the accompanying drawings.

BRIEF DESCRIPTION OF THE DRAWINGS

FIG. 1 is a perspective view of an automobile having a light emitting window assembly;

DETAILED DESCRIPTION

Figure 3:
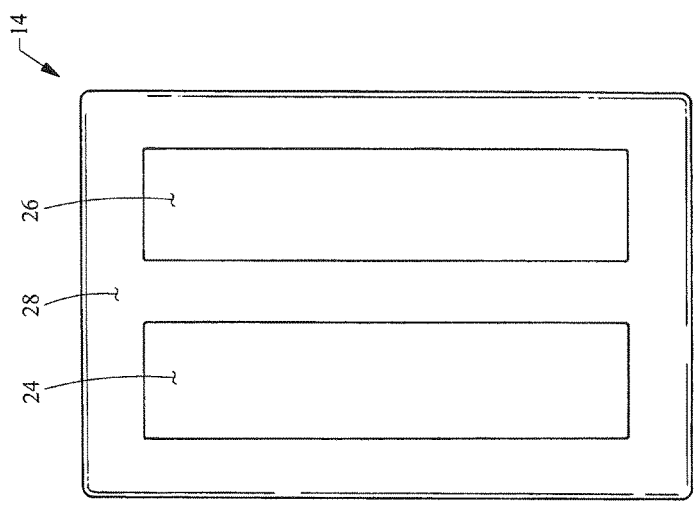
FIG. 3 is a top view of another embodiment of the window assembly.

Referring to FIG. 1, an automobile 10 is shown therein. The automobile 10 includes an occupant compartment 12 located within the interior of the automobile 10 and a window assembly 14 mounted via a frame 16 to the automobile 10. As will be fully described in the following, the window assembly 14 provides illumination to the occupant compartment 12 as indicated by the arrows referenced by the numeral 18.

Although this description describes using the panel 14 as a sunroof or moonroof to provide illumination to the occupant compartment 12 of the automobile 10, the panel is equally applicable to other areas of the automobile 10. For example, the panel 14 may be appropriately located and dimensioned to provide the lighting requirements for a headlight, taillight, turn signal, brake light, instrument panel light, reverse light or any other light commonly found on automobiles.

Figure 2:
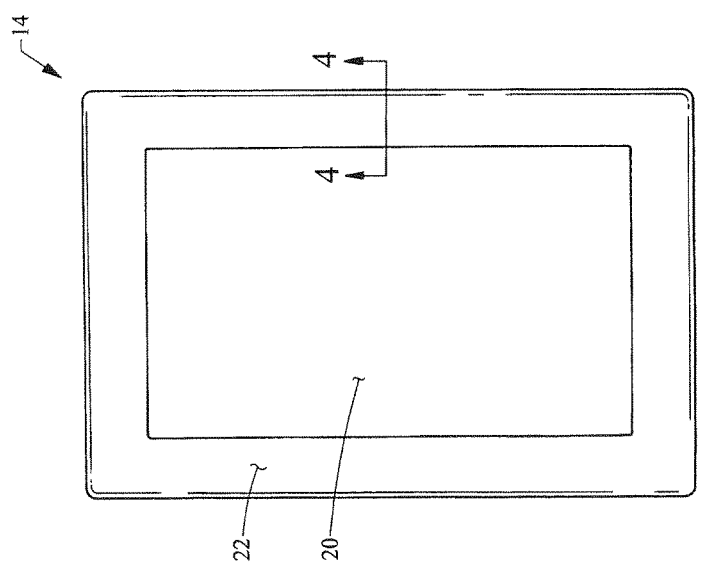
FIG. 2 is a top view of the window assembly.

Referring to FIG. 2, a more detailed view of the window assembly 14 is shown. As shown therein, the window assembly 14 has a transparent viewing area 20 and an emissive area 22. The emissive area 22 is the portion of the window assembly 14 which emits light that illuminates the occupant compartment. The transparent area 20 is similar to a conventional window assembly in that the transparent area 20 does not emit light. Similar to the transparent area 20, the emissive area 22 may be transparent, but may alternatively be opaque. Also, various configurations for the layout of the emissive area 22 and transparent areas 20 can be envisioned, configurations other than a single central transparent area 20 encircled by an emissive area 22.

Another embodiment of the window assembly 14 is shown in FIG. 3. In this layout, the window assembly 14 has two transparent areas 24, 26 surrounded and separated by an emissive area 28. Similar to the previous embodiment, the transparent area 24 is similar to a conventional window assembly, while the emissive area 28 is capable of emitting light. Obviously, the emissive area 28 may be laid out as desired in any number of patterns.

Figure 4A:
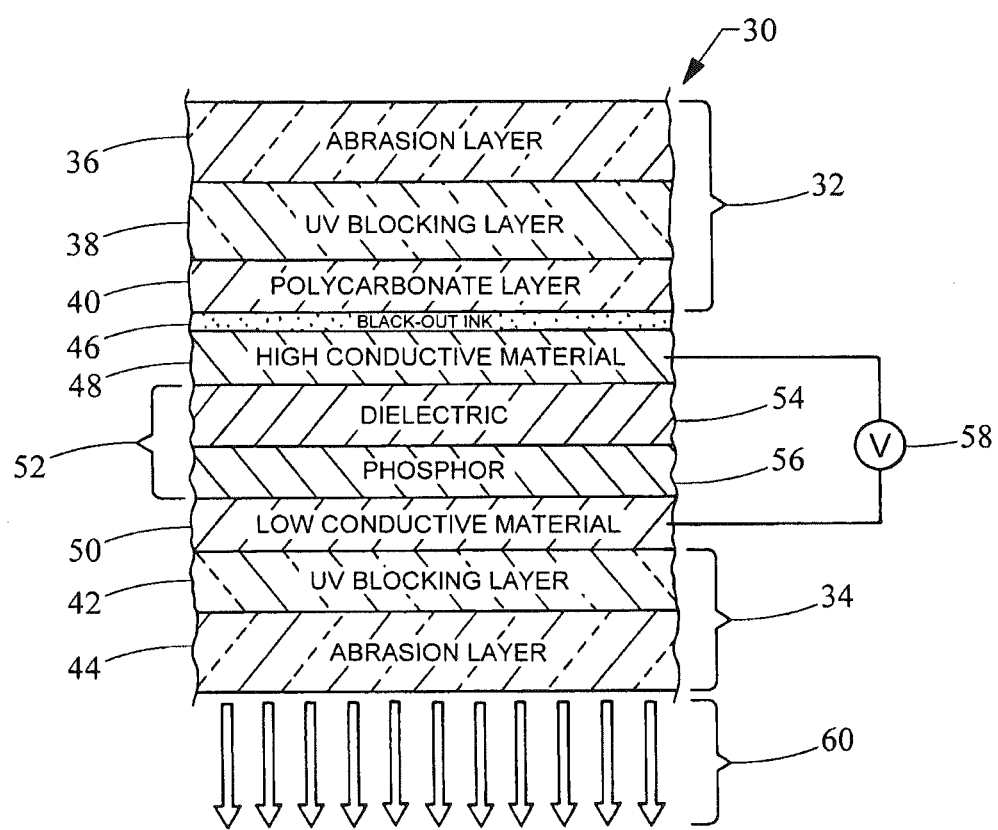
FIG. 4A is cross sectional view of a portion of the window assembly generally taken along lines 4-4 in FIG. 2.

Referring to FIG. 4A, a cross section, generally taken along lines 4-4 in FIG. 2 is shown therein. The emissive area 22 includes a first transparent panel 32 and second transparent panel 34 and between which is located the emissive element. The first transparent panel preferably includes an abrasion layer 36 and a UV blocking layer 38 provided over a base layer 40. The base layer 40 may be made of polycarbonate, polymethyl methacrylate, polyester blends, glass and glass fibers or any combination thereof. The UV blocking layer 38 may have dispersed UV absorbing additives.

The second transparent layer includes a UV blocking layer 42 and an abrasion layer 44. Similar to the first transparent panel 32, the UV blocking layer 42 of the second transparent panel 34 may have dispersed UV absorbing additives.

Coupled to the base layer 40 of the first transparent panel 32 may be a black out ink layer 46. The black out ink layer prevents any light entering the first transparent panel 32 from reaching the second transparent panel 34. Alternatively, the portion 30 may not have the black out ink layer 46.

Located between the first and second transparent panels 32, 34 is an emissive layer 52. The emissive layer 52 may be one of a variety of such light emitting structures, including, without limitation, a polymer light emitting display ("PLED"), an organic light emitting display ("OLED"), a light emitting diode ("LED") used in conjunction with a light pipe to direct light emitted by the LED to the emissive area 22 of the panel 14 or, as shown in this embodiment, an electroluminescent display ("ELD"). The emissive layer 52 includes a dielectric layer 54 and a phosphor layer 56 connected to a high conductive material the low conductive material 50, respectively.

The light emissive layer 52 can be placed onto the surface of the base layer 40 or black-out ink 46, thereby, being protected from both abrasion and UV light as this is desirable for enhancing the functioning and lifetime of the device. The light emissive layer 52 may alternatively be applied directly to the abrasive layer 36, as well as in between any existing protective layers. The light emissive layer 52 can be printed or applied by such technologies as screen printing, ink jet printing and sputtering, among others. Such printing may be performed either before or after shape forming of the window 14 or the panels 32, 34. In addition, the light emissive layer 52 can be applied to a thin polymer films by any means known to those skilled in the art, with subsequent application to the base layer 40 via film insert molding ("FIM") or lamination techniques. It may be desirable to have additional transparent layers to protect the light emissive layers during the FIM process.

A voltage source 58 is connected between the high conductive material 48 and the low conductive material 50, thereby providing a current through the dielectric 54 and the phosphor 56. When a sufficient current is provided through the dielectric 54 and the phosphor 56, light, as indicated by the arrows 60 is emitted by the emissive layer 52, between the overlying portions of the high conductive material 48 and the low conductive material 58, and is passed through the UV blocking layer 42 and the abrasion layer 44 of the second transparent panel 34.

Figure 4B:
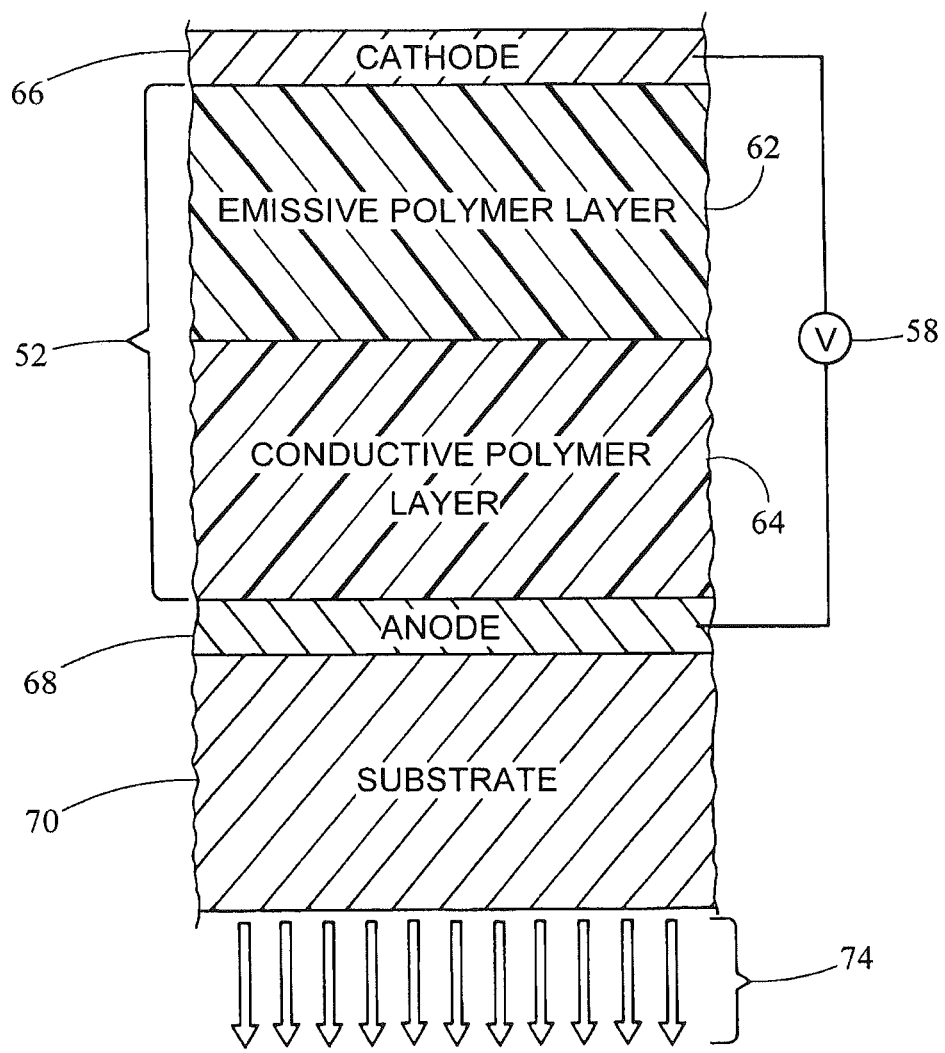
FIG. 4B is a cross sectional view similar to FIG. 4A of a window assembly using a polymer light emitting display.

Referring to the schematic representation of FIG. 4B, a PLED is used as the emissive layer 52. PLED's are typically used for backlighting and illumination, as well as the creation of displays. By definition, polymers are substances formed by a chemical reaction in which two or more molecules form into larger molecules. PLED's represent thin film displays that are created by sandwiching an undoped conjugated polymer between two proper electrodes at a very short distance.

The manufacturing of PLEDs comprises a unique deposition sequence. This sequence includes the following steps: 1) forming the structured transparent conductive oxide (e.g., indium tin oxide, etc.) anode; 2) inkjet printing the layer which will inject P-charge carriers; 3) inkjet printing of the PLED layer; 4) curing to evaporate the solvents necessary for the printing (e.g., about 98% solvents & 2% solid content); 5) deposition of the cathode by metal evaporation (Ba/Ca, then Al); and 6) encapsulation by depositing transparent layers (e.g. combination of $SiN_x$ and a scratch-resistant coating) For example, the above steps in this process cannot be performed out of sequence or in the reverse manner. Starting the steps with the cathode (Ba—Al) is not possible because barium is very sensitive to the solvents necessary for the inkjet printing of the PLED material.

The emissive layer 52 includes an emissive polymer 62 such as polyphenylene vynylene ("PPV") or polyflourene, and a conductive polymer 64 such as polydioctyl-bithiophene or polyaniline. Sandwiching the emissive polymer 62 and the conductive polymer 64 are a cathode 66 and an anode 68. To provide support, a substrate 70 is located beneath the anode 68.

As a consequence of this deposition process, the emission of light from a PLED is always in the direction that goes through the transparent substrate. This means that in order to use a PLED to illuminate a vehicle by depositing or printing the PLED directly onto a transparent plastic substrate, the PLED will need to be on the outside of the vehicle where it will be difficult to protect from environmental degradation.

Figure 4C:
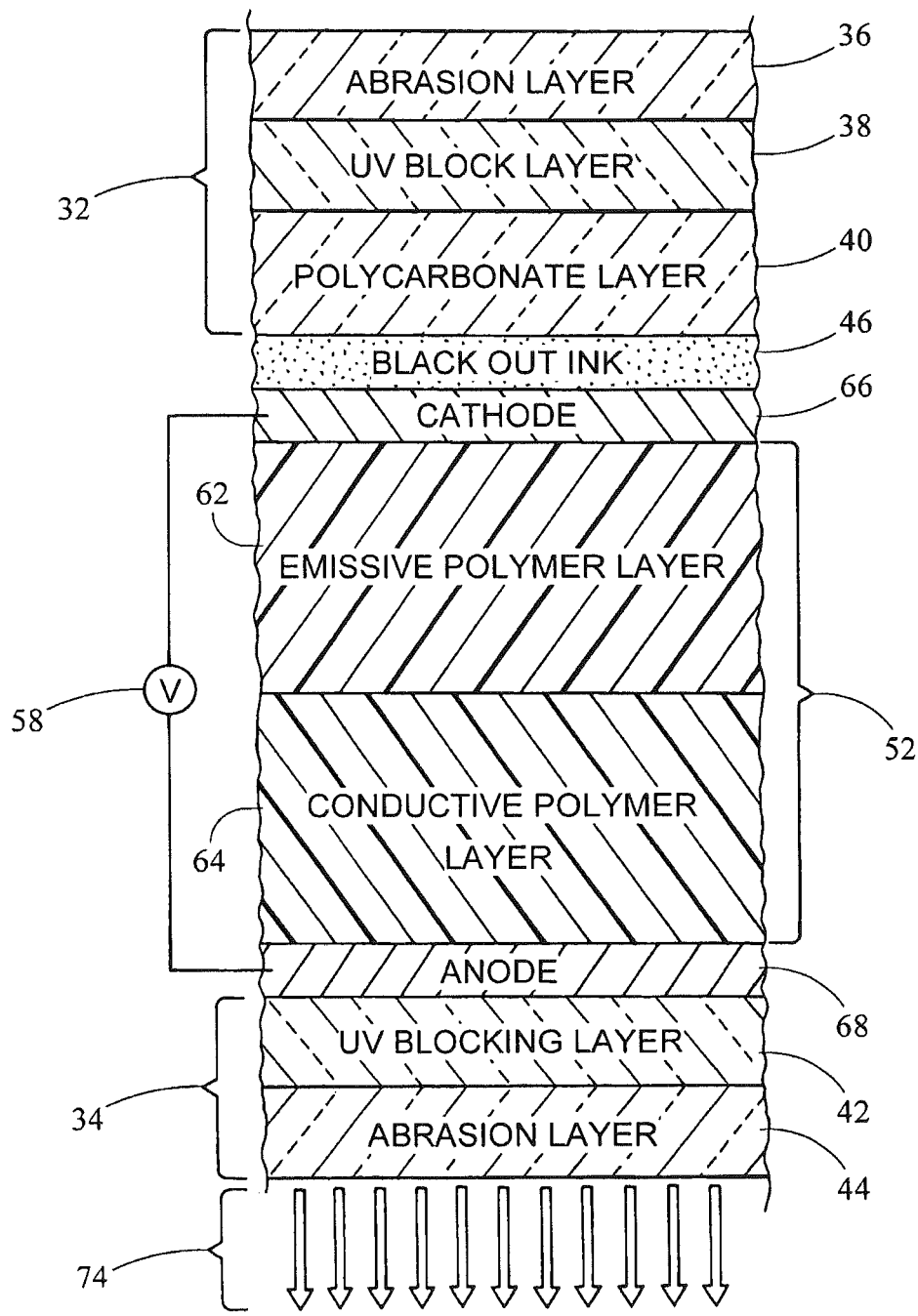
FIG. 4C is a cross sectional view similar to FIG. 4A of the window assembly of the window assembly using a polymer light emitting display as the emissive layer and a conductive ink.

In order to have the illumination projected into the vehicle, the integration of the PLED into the window/roof assembly from the inside with an adhesive is preferred and is shown in FIG. 4C. One type of adhesive system available for this type of process includes hot melt bonding.

Referring to FIG. 4C, the PLED is shown integrated into the window assembly 14. Similar to FIG. 4A, the window assembly 14 has a first and second abrasion layer 36, 44 each coupled to a first and second UV blocking layer 38, 42.

Beneath the other UV blocking layer is a base layer, such as a polycarbonate panel 40. Painted onto the polycarbonate panel 40 is a black-out ink layer 46. Coupled between the black-out ink layer 46 and the second UV blocking layer 42 are the cathode 66 and anode 68, respectively. Between the cathode 66 and anode 68 is the emissive layer 52 having the emissive polymer layer 62 and the conductive polymer layer 64. The voltage source 58 provides a current through the cathode and anode 68. When a sufficient current passes through the emissive layer 52, the emissive layer 52 will produce a light indicated by the arrows referenced by numeral 74.

Figure 4D:
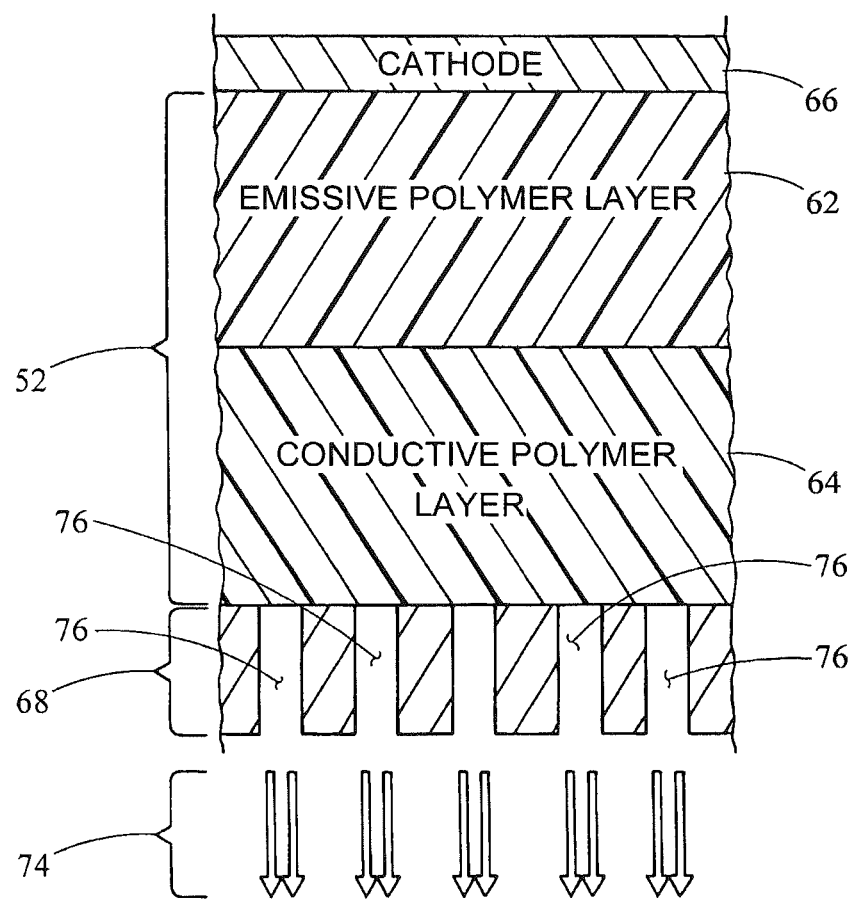
FIG. 4D is a cross sectional view of a window assembly using a PLED as the emissive layer.

In the embodiments of either FIG. 4B or 4D, when a voltage source 58 provides a sufficient current through the emissive polymer layer 62 and the conductive polymer 64 layer via the cathode 66 and anode 68, the emissive polymer layer 62 will emit light, as denoted by the arrows designated at 74.

Referring to FIG. 4D, another embodiment of a PLED light emissive layer 52 is shown. In this embodiment, the anode 68 is constructive of a metallic paste or ink, such as a silver ink sold under the trademark Paramod by Paralec Incorporated. The ink 68 is arranged in a grid pattern defining holes 76. The holes 76 allow for various degrees of illumination in areas in which the conductor is not present. The metallic paste or ink may be also utilized when using OLED's, ELD's or LED's as the emissive layer.

Figure 4E:
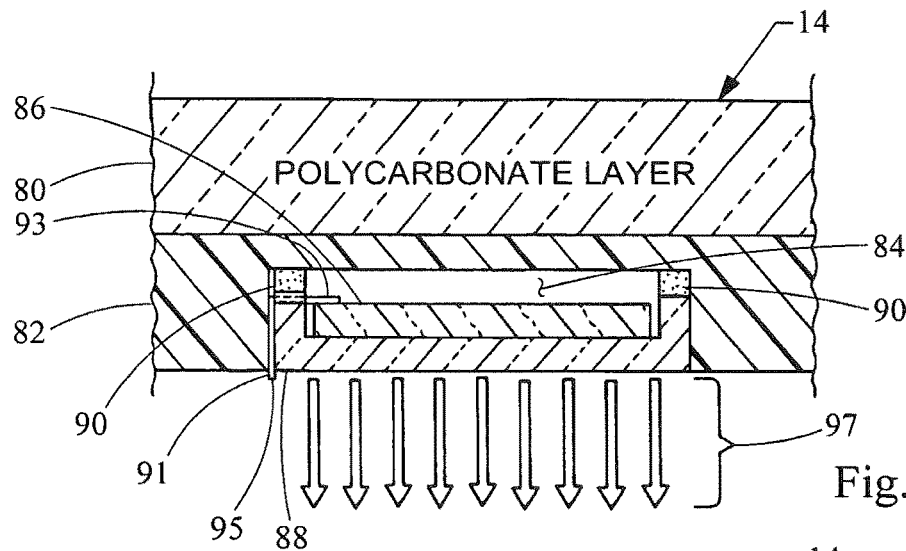
FIG. 4E is a cross sectional view similar to FIG. 4A of a window assembly made using a two shot process.

Referring to FIG. 4E, another schematic representation of the emissive area 22 of the window assembly 14 is shown. The window assembly 14 includes a base layer 80 (a polycarbonate or other material layer) as the first shot in a two component molding process. A colored frame 82 is coupled to the polycarbonate layer 14 by a second molding shot in the two component molding process. The molding of the colored frame 82 can be done in such a way as to form a recess cavity 84 in the frame. An emissive lighting system 86 such as a PLED, OLED, ELD, or LED emissive layer is therefore located within the cavity 84. To enclose the cavity and protect the emissive lighting system 86 is a polycarbonate plug 88. The polycarbonate plug may be attached to the cavity by an adhesive 90, frictional engagement or other suitable fashion, and along with the base layer 80, may be coated with an UV protection layer and an abrasion layer.

An electrical contact 91, such as a conductive wire, having a first end 93 and a second end 95 is situated between the plug 88 and the frame 82 such that the first end 93 of electrical contact 91 is in electrical communication with the emissive lighting system 86. A power supply (not shown) is connected to the second end 95 of the electrical contact. When the power supply provides a sufficient current to the lighting system 86, the lighting system 86 will emit light through the plug 88 as indicated by arrows 97.

It is possible to eliminate the additional UV protection layer. For example, the exterior of the base layer 40 may be coated with the Exatec® 900 Glazing system sold by Exatec, LLC of Michigan, and on the inside with only a "glass-like" coating deposited by plasma enhanced chemical vapour deposition ("PECVD") or other processes known to those skilled in the art. The PLED may be separately formed on a transparent polycarbonate film or substrate, which can be subsequently coated with the "glass-like" coating. The embodiment above offers the advantage that the coating process for the PLED is separate from the coating process for the window assembly 14. Moreover, the process of making the PLED can be technically and economically optimized independent of the window assembly 14 coating process.

Figure 5:
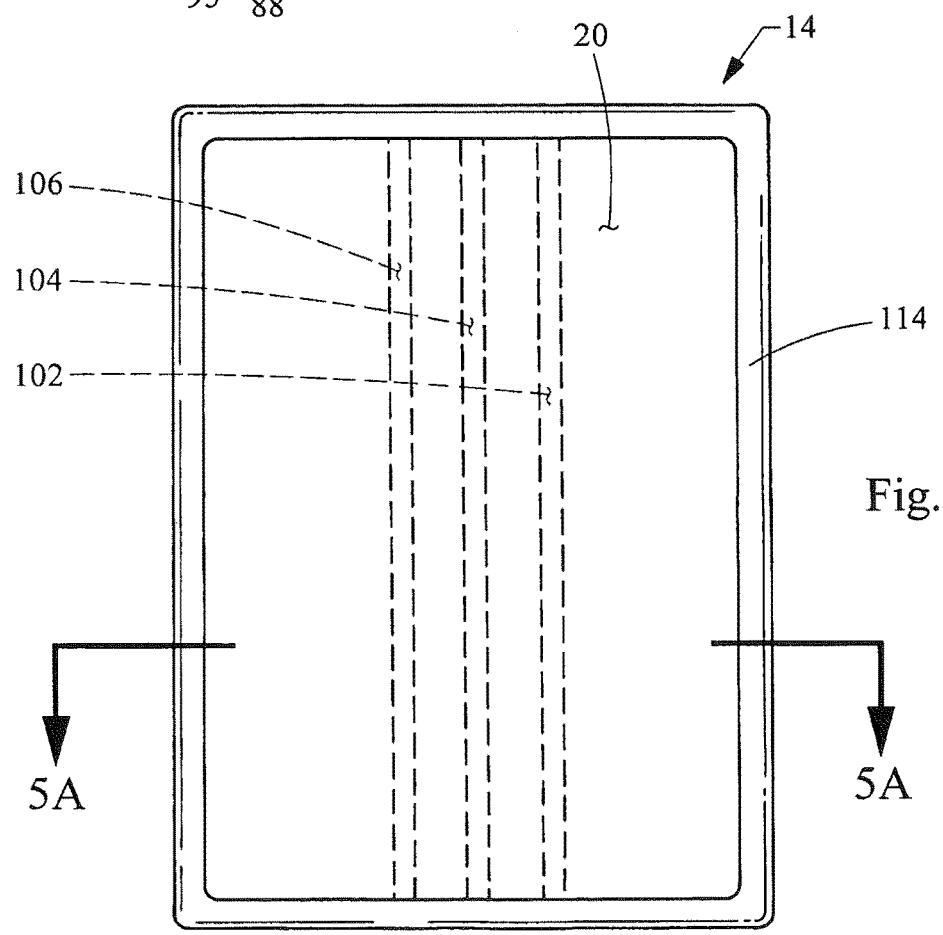
FIG. 5 is a top view of another embodiment of the window assembly.

Referring to FIG. 5, a more detailed view of another embodiment of the window assembly 14 is shown. As shown therein, the window assembly 14 has a transparent viewing area 20. Located within the transparent view area 20 are multiple light emissive areas 102, 104, 106. Surrounding the window assembly 14 is a frame 114. As will be explained later, the frame 114 contains one or more light sources for providing illumination to the emissive areas 102, 104, 106.

Figure 5A:
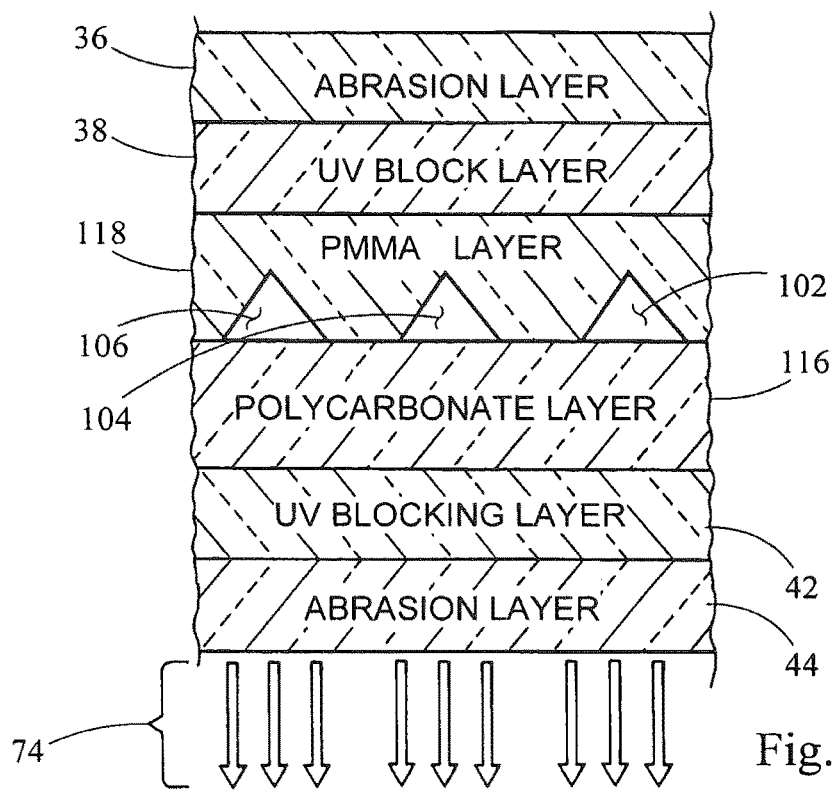
FIG. 5A is a cross sectional view of a portion of the window assembly generally taken and lines 5A-5A in FIG. 5.

Referring to FIG. 5A, a cross section, generally taken along lines 5A-5A in FIG. 5 is shown therein. The window assembly 14 includes a polycarbonate layer 116 coupled to a polymethyl methcrylate ("PMMA") layer 118. Preferably, a FIM technique is used to couple the polycarbonate layer 116 to the PMMA layer 118. Define between the PMMA layer 118 and the polycarbonate layer 116 are the emissive areas 102, 104, 106. These emissive areas are formed within the PMMA layer 118 and are enclosed by the polycarbonate layer 116 when the PMMA layer 118 is coupled to the polycarbonate layer 116. Similar to FIG. 4A, the window assembly 14 has a first and second abrasion layer 36, 44 each coupled to a first and second UV blocking layer 38, 42.

Figure 6:
FIG. 6 is a side view of the window assembly shown in FIG. 5.
Figure 6A:
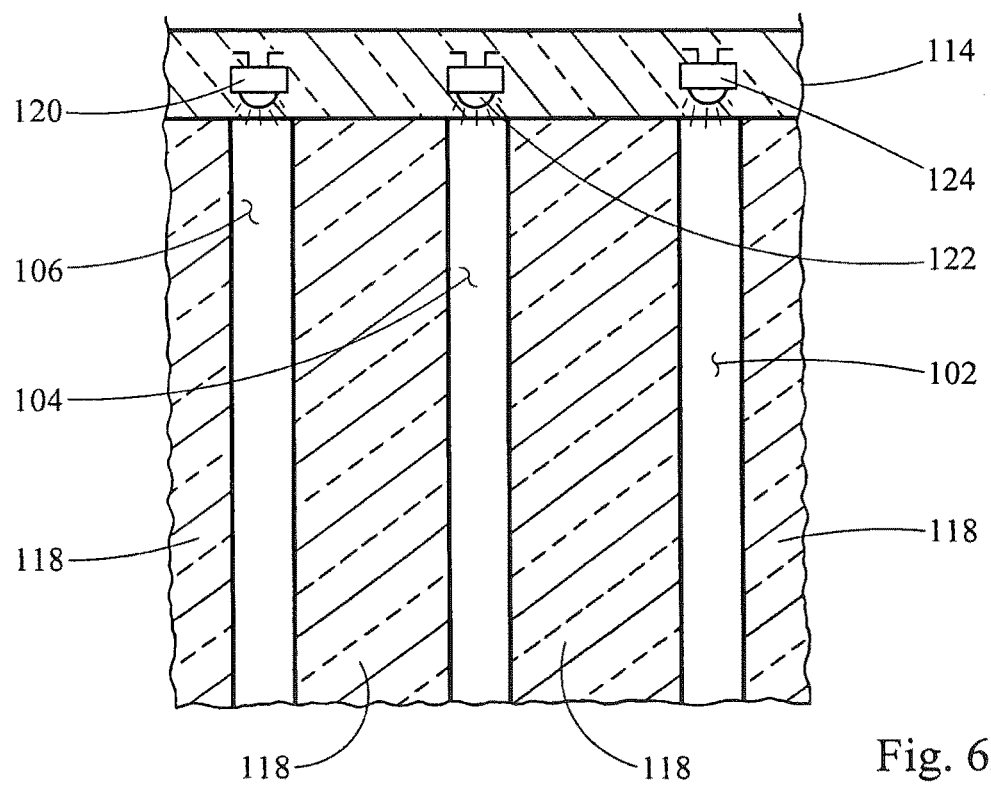
FIG. 6A is a cross sectional view of a portion of the light emissive layer generally taken along lines 6A-6A of FIG. 6.

Referring to FIGS. 6 and 6A, a side view of the window assembly 14 and a cross sectional view of the window assembly 14 generally taken along lines 6A-6A of FIG. 6 are shown. As described previously, the window assembly 14 includes light emissive areas (light pipes) 102, 104, 106. The light emissive areas 102, 104, 106 are flanked by portions of the PMMA layer 118. In this embodiment, the PMMA layer 118 could be replaced with other suitable materials. Located at end of the window assembly 14 is the frame 114. Within the frame 114 are LEDs 120, 122, 124. When activated, the LEDs 120, 122, 124, will emit light that will travel within the light emissive areas 102, 104, 106, via total internal reflection, with the exception that light traveling within the light emissive areas 102, 104, 106 will emit light through the polycarbonate layer 116, the UV blocking layer 42 and the abrasion layer 44, as denoted by the arrows designated at 74. Alternatively, any light source, such as an electroluminescent display, an organic light emitting diode and a polymer light emitting diode, may be used as light source.

Inasmuch as the foregoing disclosure is intended to enable one skilled in the pertinent art to practice the instant disclosure, it should not be construed to be limited thereby but should be construed to include such aforementioned obvious variations and be limited only by the spirit and scope of the following claims.

The invention claimed is:

1. A light emissive window assembly for providing illumination to an occupant compartment of an automobile comprising:
   a window panel comprising a transparent viewing area and an emissive area, wherein the emissive area is configured to emit light into the occupant compartment and the transparent viewing area is not configured to emit light;
   wherein the emissive area comprises
      an abrasion resistant layer,
      an ultraviolet protective layer,
      a base layer, and
      an emissive layer;
      wherein the ultraviolet protective layer is located in between the abrasion resistant layer and the base layer; and wherein the base layer is located in between the ultraviolet protective layer and the emissive layer; and
   wherein the transparent viewing area comprises a first transparent area separated from a second transparent area by the emissive area which encircles both the first and second transparent areas or wherein the emissive area is in the form of a line located in between a first transparent viewing area and a second transparent viewing area.

2. The light emissive window assembly of claim 1, further comprising a black out layer located in between the base layer and the emissive layer.

3. The light emissive window assembly of claim 1, wherein the emissive area encircles the transparent viewing area.

4. The light emissive window assembly of claim 1, wherein the transparent viewing area comprises the first transparent area separated from the second transparent area by the emissive area which encircles both the first and second transparent areas.

5. The light emissive window assembly of claim 1, wherein the base layer comprises a polycarbonate, poly(methyl methacrylate), a polyester, glass, or a combination comprising at least one of the foregoing.

6. The light emissive window assembly of claim 1, wherein the base layer comprises a polycarbonate.

7. The light emissive window assembly of claim 1, wherein the ultraviolet protective layer has dispersed ultraviolet absorbing additives.

8. The light emissive window assembly of claim 1, wherein the emissive layer comprises a dielectric layer and a phosphor layer; wherein the dielectric layer is located in between the base layer and the phosphor layer.

9. The light emissive window assembly of claim 1, wherein the emissive layer comprises a polymer light emitting display, an organic light emitting display, a light emitting diode, or an electroluminescent display.

10. The light emissive window assembly of claim 1, further comprising a frame coupled to a perimeter of the emissive area.

11. The light emissive window assembly of claim 1, further comprising a high conductive layer located in between the base layer and the emissive layer; and a low conductive layer; wherein the emissive layer is located in between the high conductive layer and the low conductive layer.

12. The light emissive window assembly of claim 11, further comprising a voltage source connected to the high conductive layer and the low conductive layer.

13. The light emissive window assembly of claim 11, wherein one or both of the high conductive layer and the low conductive layer comprises at least one of a conductive ink and a conductive wire.

14. A light emissive window assembly for providing illumination to an occupant compartment of an automobile comprising:
a window panel comprising a transparent viewing area and an emissive area, wherein the emissive area is configured to emit light into the occupant compartment and the transparent viewing area is not configured to emit light;
wherein the emissive area comprises
an abrasion resistant layer,
an ultraviolet protective layer,
a base layer, and
an emissive layer;
a further ultraviolet protective layer and a further abrasion resistant layer;
wherein the ultraviolet protective layer is located in between the abrasion resistant layer and the base layer; and wherein the base layer is located in between the ultraviolet protective layer and the emissive layer; and wherein the further abrasion resistant layer is located on an opposite side of the emissive layer as the abrasion resistant layer; and wherein the further ultraviolet protection layer is located in between the emissive layer and the further abrasion resistant layer.

15. A light emissive window assembly for providing illumination to an occupant compartment of an automobile comprising:
a window panel comprising a transparent viewing area and an emissive area, wherein the emissive area is configured to emit light into the occupant compartment and the transparent viewing area is not configured to emit light;
wherein the emissive area comprises
an abrasion resistant layer;
an ultraviolet protective layer;
a base layer;
a black out layer;
an emissive layer;
a further ultraviolet protective layer; and
a further abrasion resistant layer;
wherein the ultraviolet protective layer is located in between the abrasion resistant layer and the base layer; wherein the base layer is located in between the ultraviolet protective layer and the emissive layer; wherein the black out layer located in between the base layer and the emissive layer; wherein the further abrasion resistant layer is located on an opposite side of the emissive layer as the abrasion resistant layer; and wherein the further ultraviolet protection layer is located in between the emissive layer and the further abrasion resistant layer.

16. The light emissive window assembly of claim 15, wherein the emissive layer comprises a dielectric layer and a phosphor layer; wherein the dielectric layer is located in between the base layer and the phosphor layer.

17. The light emissive window assembly of claim 15, further comprising a high conductive layer located in between the base layer and the emissive layer; and a low conductive layer; wherein the emissive layer is located in between the high conductive layer and the low conductive layer.

18. The light emissive window assembly of claim 15, wherein the emissive layer comprises a polymer light emitting display, an organic light emitting display, a light emitting diode, or an electroluminescent display.

19. The light emissive window assembly of claim 15, wherein the emissive area encircles the transparent viewing area.

* * * * *